United States Patent [19]

Watari

[11] Patent Number: 4,894,708
[45] Date of Patent: Jan. 16, 1990

[54] LSI PACKAGE HAVING A MULTILAYER CERAMIC SUBSTRATE

[75] Inventor: Toshihiko Watari, Tokyo, Japan

[73] Assignee: NEC Corporation, Tokyo, Japan

[21] Appl. No.: 630,266

[22] Filed: Jul. 12, 1984

[30] Foreign Application Priority Data

Jul. 19, 1983 [JP] Japan ............................ 58-131422

[51] Int. Cl.⁴ .................... H01L 39/02; H01L 27/02
[52] U.S. Cl. .................................. 357/80; 357/70; 357/71; 357/74; 357/40; 357/45
[58] Field of Search .................... 357/80, 74, 71, 40, 357/45, 70

[56] References Cited

U.S. PATENT DOCUMENTS 4,221,047 9/1980 Narken et al. ..................... 357/80
4,407,007 9/1983 Desai et al. ....................... 357/80

OTHER PUBLICATIONS

Clark et al., "IBM Multichip Multilayer Ceramic Modules for LSI Chips–Design for Performance and Density", IEEE Transaction on Components, Hybrids, and Manufacturing Technology, vol. CHMT-3, No. 1, Mar. 1980, pp. 89–93.

Primary Examiner—William L. Sikes
Assistant Examiner—Georgia Y. Epps
Attorney, Agent, or Firm—Foley & Lardner, Schwartz, Jeffery, Schwaab, Mack, Blumenthal & Evans

[57] ABSTRACT

A large scale integrated package comprises a substrate having a power supply layer and a signal wiring layer. A plurality of pads for connecting IC terminals are formed on the top surface of the substrate. Additionally, a plurality of spare pads are also provided on the top surface of the substrate. The lower surface of the substrate has a plurality of input/output terminals which can be inserted into connectors. Additionally, the lower surface of the substrate has a plurality of spare terminals. Each of the pads and spare pads are electrically connected through the substrate to a corresponding terminal and spare terminal. A broken connection between a first pad and a first input/output terminal can be repaired by connecting the first pad to a spare pad and the first input/output terminal to the spare input/output terminal corresponding to the spare pad.

9 Claims, 2 Drawing Sheets

LSI PACKAGE HAVING A MULTILAYER CERAMIC SUBSTRATE

BACKGROUND OF THE INVENTION

The present invention relates to an LSI (large scale integrated) package having a multilayer ceramic substrate mounted densely with a plurality of integrated circuit (IC) chips.

High density LSI packages using alumina ceramic substrates are in use recently in high performance computers. The package includes densely wired layers formed on the upper surface of the ceramic substrate, a number of IC chips mounted densely on the upper surface of the top wiring layer, and a plurality of pin-shaped input/output (I/O) terminals arranged in matrix form on the lower surface of the ceramic substrate. Since the ceramic substrate has a thermal expansion coefficient well matching that of the silicon, which is the main component of each IC chip, these IC chips can be directly adhered to the substrate. As a result, the high density mounting of the IC chips on the substrate can be facilitated. By arranging the I/O terminals in matrix form throughout the whole lower surface of the substrate, it also facilitates an increase in the number of the I/O terminals per package to achieve higher density and integration of LSI packages. The alumina ceramic substrate is most suitable to sufficiently support such I/O terminals arranged in a matrix fashion.

However, the manufacturing yield of such an LSI package is not very high, because high density and fine formation are required for the wiring formed inside the alumina ceramic substrate. In other words, it is not quite possible to form the wiring completely despite full and meticulous care and control in manufacture.

Changes in the design may often become necessary after the design and manufacture of multilayer circuit substrates have been completed. Such a change in design requires a change in wiring. Therefore, a structure which permits such a repair and remodelling or wiring on the multilayer circuit substrate becomes desirable.

One example of such a change or repair technique for the wiring between plural numbers of IC chips is proposed in an article entitled "IBM Multichip Multilayer Ceramic Modules for LSI Chips—Design for Performance and Density" by BERNARD T. CLARK et al in the IEEE Transaction on Components, Hybrids and Manufacturing Technology, Vol. CHMT-3, No. 1, Mar. 1980 issue, pp. 89-93.

Although such a technique may be effective for the change or repair of the wiring between the IC chips, it is not so for the repair of the wiring between the IC chips and pin-shaped I/O terminals mounted on the lower surface of the substrate. This is because the conventional type substrate has no special wiring to connect a specific IC chip terminal and a specific I/O terminal when there occurs a manufacturing defect in the connection of the two terminals.

It is not necessarily impossible to bore a hole from the upper surface of the conventional type ceramic substrate to the lower surface thereof for passing the wire therethrough, but this is not a realistic solution in view of the difficulties arising in the substrate manufacture and of the excessively lowered wiring density.

SUMMARY OF THE INVENTION

One object of the present invention is, therefore, to provide an improved LSI package free from the above-mentioned disadvantages in the prior art package.

According to one aspect of the invention, there is provided an LSI package which comprises a ceramic substrate provided with a plurality of input/output terminals on the lower surface thereof. The substrate at least one power supply layer having a plurality of conductive lines therethrough and a plurality of metallized. The through-holes are formed from the lower surface to the upper surrace of the substrate so as to connect each of the input/output terminals. Additionally, the substrate has a plurality of signal wiring layers formed on the upper surface of the substrate, each layer having a plurality of conductive lines. A plurality of pads are formed on the upper surface of the top signal wiring layer, for allowing the mounting and connection of circuit elements. A plurality of spare pads are on the surface of the top signal wiring layer for connecting repair wires. A plurality of space terminals are formed on the lower surface of the substrate; and spare wiring means is provided respectively through the substrate and the signal wiring layers to electrically connect each of these spare pads and spare terminals.

BRIEF DESCRIPTION OF THE DRAWINGS

The features and advantages of the present invention will become apparent from the following description when taken conjunction with the accompanying drawings in which.

DETAILED DESCRIPTION OF THE PREFERRED EMBODIMENTS

Figure 1:
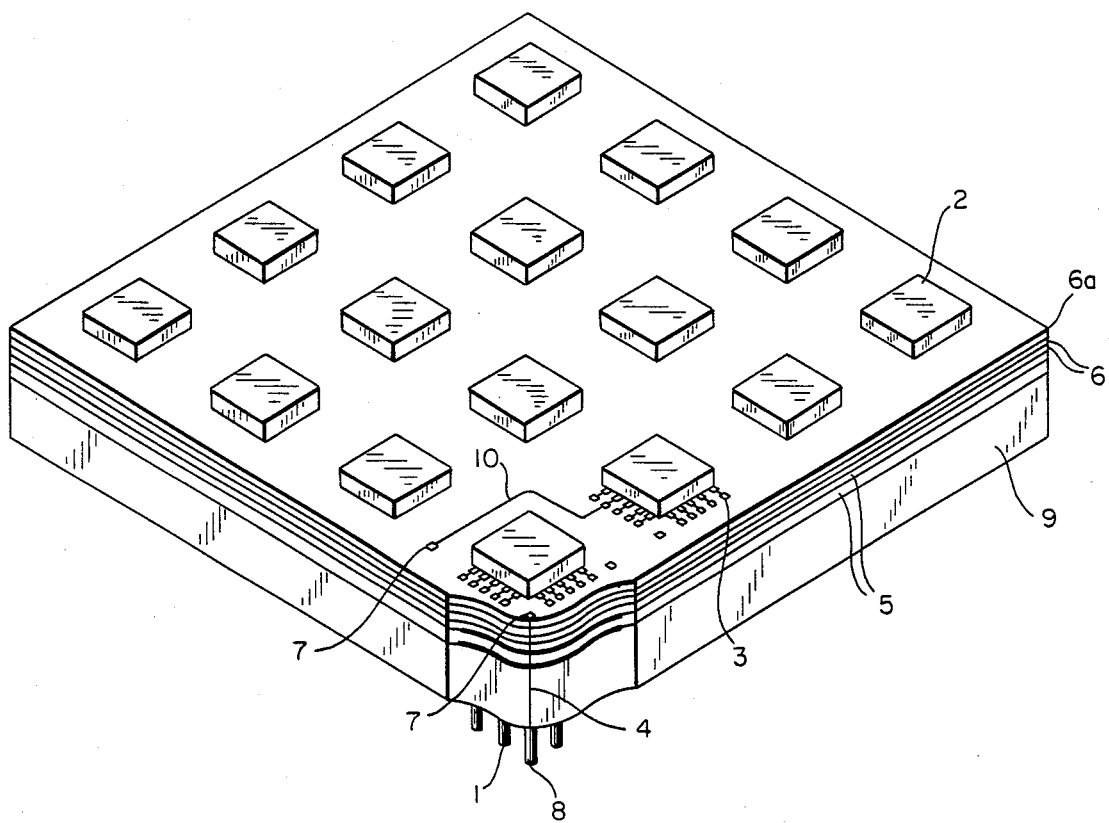
FIG. 1 is a partially enlarged perspective view of a preferred embodiment of the invention.

In the drawings, the like reference numbers denote the like structural elements.

The present invention will now be described in further detail referring to the drawings Referring to FIG. 1, one embodiment of the invention comprises a ceramic substrate 9 provided with two power supply layers 5, each of which has a plurality of conductive lines; plural signal wiring layers 6 formed on the upper surface of the ceramic substrate 9 and having a plurality of conductive lines, a plurality of pads 3 for connecting IC terminals (not shown) and a plurality of spare pads 7 formed on the upper surface of the top one 6a of the wiring layers 6; a plurality of IC chips 2 mounted on the upper surface of the layer 6a; a plurality of I/O terminals 1; a plurality of terminals 11 provided for supplying the power from a power source (not shown) to the layers 5; and a plurality of spare terminals 8 provided on the lower surface of the substrate 9.

The I/O terminals 1 are mounted onto the lower surface of the substrate 9 in matrix form along with the pin-shaped spare terminals 8. These terminals 1, are usually inserted into connectors (not shown) provided on a printed circuit board (not shown) to be interconnected with other LSI packages. The terminals if the IC chips 2 housed within a known chip carrier are connected to the pads 3 on the upper surface of the top wiring layer 6a. Signal interconnection with the I/O terminals 1 and the IC chips 2 are achieved through the wiring layers 6 and a plurality of metallized through-holes 4.

Figure 2:
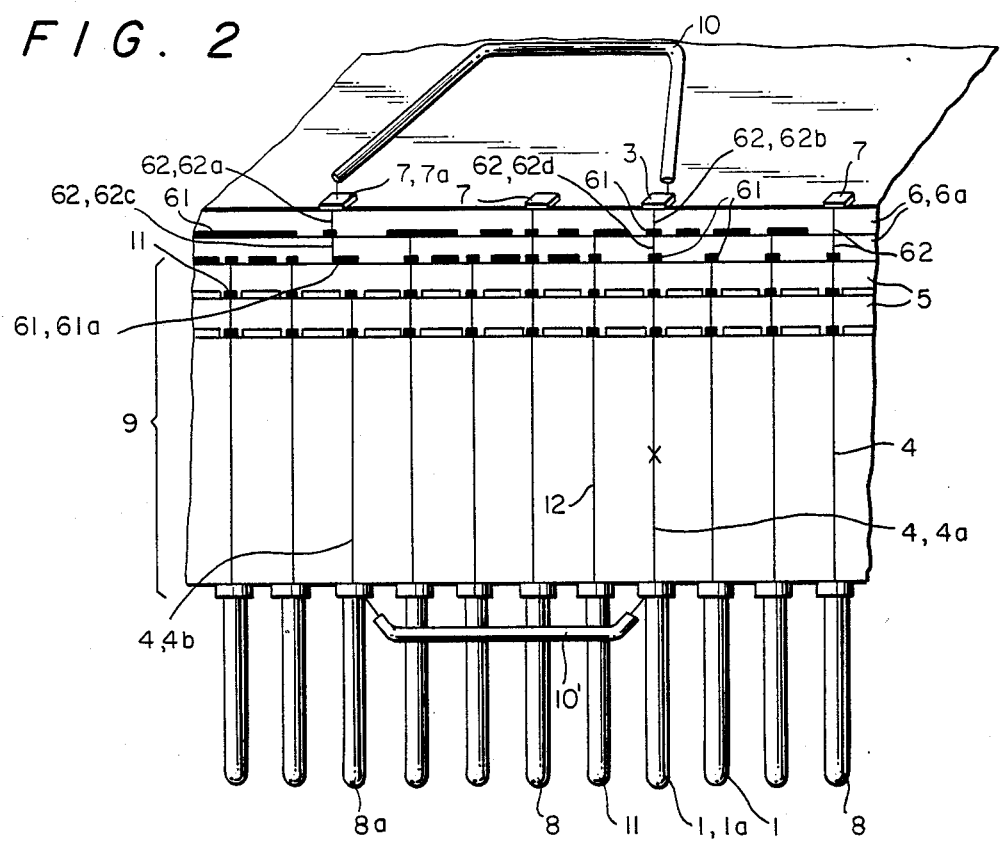
FIG. 2 is another partial cross sectional view of the embodiment.
Figure 3:
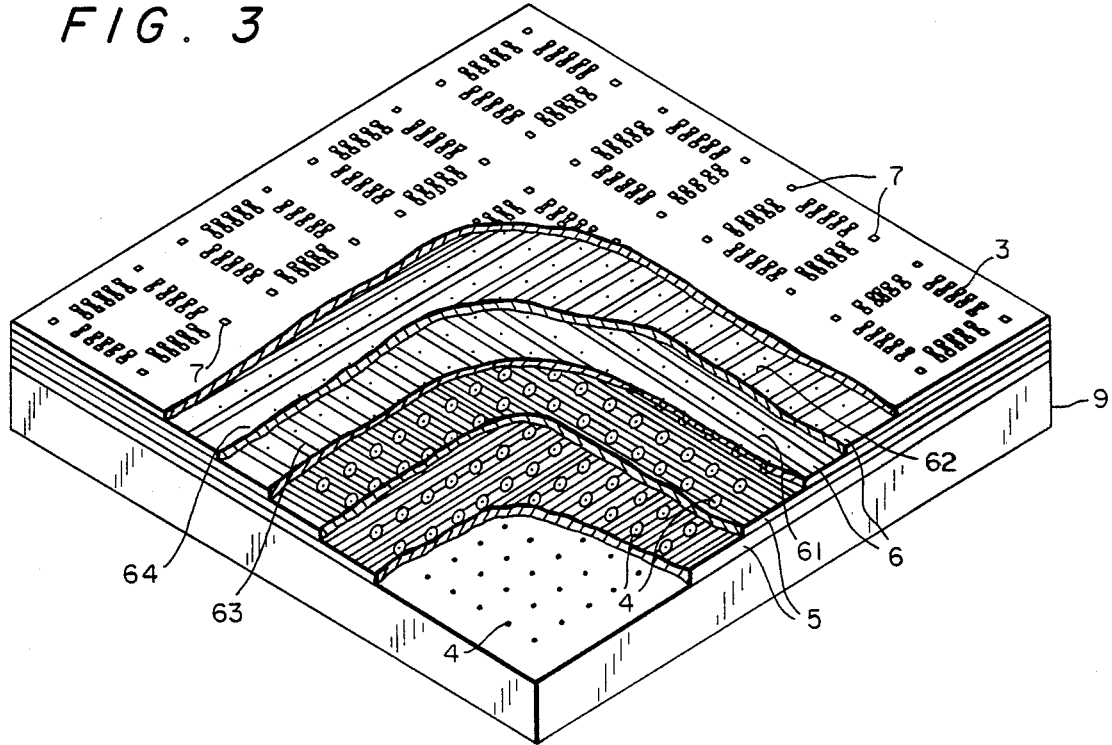
FIG. 3 is another partially enlarged perspective view of the embodiment.

Referring to FIGS. 2 and 3, in each of the signal wiring layers 6, there are formed a plurality of conductive lines 61 and a plurality of metallized via-holes 62 used for layer-to-layer connection of the lines 61. Therefore, the interconnection between the terminals of the IC chips 2 is achieved by the lines 61 and the via-holes 62 formed in the wiring layers 6. Furthermore, the connection between the pad 3 and the I/O terminal 1 is achieved through the route of the pad 3—the via-hole 62b—the via-hole 62d—the through-hole 4a—the terminal 1, for instance.

The conductive lines 11 formed in a net-like fashion inside the power supply layers 5 become a power source circuit having a low impedance by interconnecting the through-holes 4 connected to the same power source. Through-holes 12 connected to the power source via the terminals 11 are connected to the pads 3 via the lines 61, and the via-holes 62 to supply power to the pads 3 to be connected to the power terminals of the IC chips 2.

In response to a disconnection at a point marked X in a metallized through-hole 4a connecting the I/O terminal 1a and the pad 3 to which one of IC terminals is connected, the repair is performed as follows. The pad 3 and the spare pad 7a are connected first via a repair wire 10 on the upper surface side of the top wiring layer 6a. The pad 7a is connected to the spare terminal 8a on the lower surface of the substrate 9 via spare wiring means formed of the via-holes 62a and 62c, the line 61a, and a through-hole 4b. The terminals 8a and 1a are then connected via the repair wire 10' on the lower side of the substrate 9, so that the connection via the route of 3–10–7a–62a–62c–51a–4b–8a–10'–1a is achieved to complete the repair.

The embodiment shown in FIG. 2 shows the spare terminals 8 shaped similarly like a pin as the other I/O terminals 1, but this shape is not necessarily to be limited to the pin. It may be shaped like a pad as well so long as it can be connected to the repair wire 10'.

The present invention is advantageous in that the spare pads, the spare terminals, an the spare wiring means provided redundantly on the substrate enable repair of disconnections in the wiring connecting the I/O terminals and the pad by merely adding the repair wires on the upper surface side and lower surface side of the substrate.

Many alternatives and modifications to the embodiment can be made within the scope of the invention defined in the appended claim.

What is claimed is:

1. A large scale integrated package comprising:
   a substrate;
   a plurality of first input/output terminals mounted onto a first face of said substrate;
   a plurality of first pads mounted onto a second face of said substrate for receiving integrated chip terminals, each of said plurality of first pads corresponding to a different one of said plurality of first input/output terminals;
   a plurality of second input/output terminals mounted onto said first face of said substrate, wherein said plurality of second input/output terminals are spare terminals;
   a plurality of second pads mounted onto said second face of said substrate, each of said second pads corresponding to a different one of said plurality of second input/output terminals, wherein said second pads are spare pads;
   a plurality of electrically conductive first paths formed within said substrate for connecting each of said first pads to said corresponding one of said first input/output terminals;
   a plurality of electrically conductive second paths formed within said substrate for connecting each of said second pads to said corresponding one of said second input/output terminals; and
   wherein, in operation, a signal passes through said second paths only when at least one of said plurality of second pads is connected to one of said plurality of first pads via a first repair wire.

2. The large scale integrated package of claim 1, wherein said substrate comprises a power supply layer and a signal wiring layer.

3. The large scale integrated package of claim 1, wherein said substrate comprises a plurality of power supply layers and a plurality of signal wiring layers.

4. The large scale integrated package of claim 2, wherein said electrically conductive paths are comprised of conductive lines extending through said power supply layer and metallized holes extending through said signal wiring layer.

5. The large scale integrated package of claim 1, further including a second repair wire connecting one of said plurality of first input/output terminals to one of said plurality of second input/output terminals.

6. The large scale integrated package of claim 1, wherein said spare pads do not directly connect to an integrated chip terminal.

7. The large scale integrated package of claim 1, wherein said plurality of first input/output terminals comprise electrically conductive pins.

8. The large scale integrated package of claim 1, wherein said plurality of second input/output terminals comprise electrically conductive pins.

9. A method of repairing wiring between input/output terminals and pads on an integrated chip carrying substrate comprising the steps of:
   (a) identifying a broken connection between a first input/output terminal on a first surface of said substrate and a first pad on an opposite, second surface of said substrate, wherein said first pad is connectable to an integrated chip terminal;
   (b) electrically connecting said first pad to a spare pad, wherein said spare pad is electrically connected to spare input/output terminal; and
   (c) electrically connecting said spare input/output terminal to said first input/output terminal;
   whereby said broken connection is repaired by producing a bypass electrically connecting path using a spare input/output terminal and pad.

* * * * *